(12) United States Patent
Xiang et al.

(10) Patent No.: US 10,312,345 B2
(45) Date of Patent: Jun. 4, 2019

(54) TRANSISTOR HAVING A GATE WITH A VARIABLE WORK FUNCTION AND METHOD FOR MANUFACTURING THE SAME

(71) Applicant: INSTITUTE OF MICROELECTRONICS, CHINESE ACADEMY OF SCIENCES, Beijing (CN)

(72) Inventors: Jinjuan Xiang, Beijing (CN); Xiaolei Wang, Beijing (CN); Hong Yang, Beijing (CN); Shi Liu, Beijing (CN); Junfeng Li, Beijing (CN); Wenwu Wang, Beijing (CN); Chao Zhao, Kessel-lo (BE)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/871,690

(22) Filed: Jan. 15, 2018

(65) Prior Publication Data
US 2018/0294342 A1    Oct. 11, 2018

(30) Foreign Application Priority Data

Apr. 11, 2017 (CN) .......................... 2017 1 0233040

(51) Int. Cl.
| H01L 21/3205 | (2006.01) |
| H01L 29/66 | (2006.01) |
| H01L 21/265 | (2006.01) |
| H01L 29/49 | (2006.01) |

(52) U.S. Cl.
CPC ...... H01L 29/66545 (2013.01); H01L 21/265 (2013.01); H01L 29/4966 (2013.01)

(58) Field of Classification Search
None
See application file for complete search history.

(56) References Cited

U.S. PATENT DOCUMENTS

| 8,941,184 B2 * | 1/2015 | Ando | ................ H01L 21/82384 257/213 |
| 9,899,270 B2 * | 2/2018 | Xu | ..................... H01L 21/28088 |
| 2007/0059929 A1 * | 3/2007 | Cho | ......................... C23C 16/36 438/681 |

* cited by examiner

*Primary Examiner* — Hung K Vu
(74) *Attorney, Agent, or Firm* — Hamre, Schumann, Mueller & Larson, P.C.

(57) ABSTRACT

The present disclosure provides a method for manufacturing a transistor having a gate with a variable work function, comprising: providing a semiconductor substrate; forming a dummy gate stack on the semiconductor substrate and performing ion implantation on an exposed area of the semiconductor substrate at both sides of the dummy gate stack to form source/drain regions; removing the dummy gate and annealing the source/drain regions; providing an atomic layer deposition reaction device; introducing a precursor source reactant into the atomic layer deposition reaction device; and controlling an environmental factor for the atomic layer deposition device to grow a work function metal layer. The present disclosure also provides a transistor having a gate with a variable work function. The present disclosure may adjust a variable work function, and may use the same material system to obtain an adjustable threshold voltage within an adjustable range.

10 Claims, 5 Drawing Sheets

TRANSISTOR HAVING A GATE WITH A VARIABLE WORK FUNCTION AND METHOD FOR MANUFACTURING THE SAME

TECHNICAL FIELD

The present disclosure relates to a field of semiconductor, especially to a transistor having a gate with a variable work function and a method for manufacturing the same

BACKGROUND

With continuous shrinking of a feature size of a semiconductor device in proportion by Moore's Law, integration of chips continues to be increased to cause negative effects such as a short-channel effect, a coulomb scattering and the like, which brings a bottleneck for the traditional planar MOSFETs in a development of semiconductor technology to the 22 nm process. As a solution for such a problem, three-dimensional FinFET gradually becomes a mainstream technique. During a process tending to a smaller node, the filling of the metal gate in a gate-last process meets a significant challenge. A traditional PVD technique has its own inherent limitations. At present, atomic-layer deposition has become the best solution for metal gate deposition, continued miniaturization of CMOS device and accompanying back gate trench filling.

In addition, a threshold voltage of the semiconductor device is related to the work function of a material for the gate electrode. In a traditional process ofr manufacturing a semiconductor device, it usually uses a single polysilicon gate design to simplify the manufacturing process and to save production costs. When the CMOS technology is developed to 45 nm, in order to reduce the gate leakage current, a high-K gate dielectric is introduced into the semiconductor manufacturing process. However, a traditional polysilicon gate contacting with polysilicon will lead a polysilicon depletion effect and Fermi level pinning effect, etc., which seriously affects device performance, so it needs a new type of gate material. Metal gate has a lower resistivity and is considered as the preferred material for the gate.

In CMOS circuits, there are different functional circuit modules, such as high performance computing modules and low power consumption modules. Different circuit modules require different threshold voltages, i.e. different metal work functions. Therefore, it is urgently required to design a material with a variable work function as a gate to adjust the work function of the same system material during the atomic layer deposition in the process for manufacturing a transistor to obtain the expected threshold voltage characteristic of the device.

SUMMARY OF THE INVENTION

A transistor having a gate with a variable work function and a method for manufacturing the same according to the present disclosure may implement a variable work function of gate material for deficiency of the prior art, so as to get an adjustable threshold voltage of a semiconductor device.

According to a first aspect of the present disclosure, there is provided a method for manufacturing a transistor having a gate with a variable work function, comprising:
providing a semiconductor substrate;
forming a dummy gate stack on the semiconductor substrate and performing ion implantation on an exposed area of the semiconductor substrate at both sides of the dummy gate stack to form source/drain regions;
removing the dummy gate and annealing the source/drain regions;
providing an atomic layer deposition reaction device;
introducing a precursor source reactant into the atomic layer deposition reaction device; and
controlling an environmental factor for the atomic layer deposition device to grow a work function metal layer with a tunable work function.

Alternatively, the environmental factor for the atomic layer deposition reaction device comprises any one of a ratio of the precursor source reactant, a pulse sequence, a growth temperature and a growth thickness or a combination thereof.

Alternatively, a material for the work function metal layer is titanium alloy or tantalum alloy.

Alternatively, a material for the work function metal layer is TiAlC(N) or TaAlC(N).

Alternatively, the precursor source reactant for titanium in TiAlC(N) is titanium halide and/or TDMAT, the precursor source reactant for aluminum is trialkylaluminum, alkylaluminoxane and/or ammonia coordinated alumoxane, and the precursor source reactant for nitrogen is $NH_3$ and/or $N_2$.

Alternatively, the precursor source reactant for tantalum in TaAlC(N) is tantalum halide and/or PDMAT, the precursor source reactant for Aluminum is trialkylaluminum, alkylaluminoxane and/or ammonia coordinated alumoxane, and the precursor source reactant for nitrogen is $NH_3$ and/or $N_2$.

Alternatively, the ratio of the precursor source reactant comprises a ratio of the amounts of $NH_3$ and/or $N_2$.

Alternatively, the pulse sequence comprises a participating pulse sequence of $NH_3$ and $N_2$.

Alternatively, the growth temperature is adjusted to change an aluminum content ratio of the work function metal layer.

Alternatively, the atomic layer deposition is a heating type of atomic layer deposition or plasma enhanced atomic layer deposition.

According to another aspect of the present disclosure, there is provided a transistor having a gate with a variable work function, comprising a semiconductor substrate, source/drain regions, a gate with a work function metal layer, wherein a threshold voltage of the transistor is adjustable.

Alternatively, a material for the work function metal layer is titanium alloy or tantalum alloy.

Alternatively, a material for the work function metal layer is TiAlC(N) or TaAlC(N).

The transistor having a gate with a variable work function and the method for manufacturing the same according to embodiments of the present disclosure may adjust work function by adjusting a participating ratio and a pulse sequence of $N_2$ and $NH_3$, the growth temperature and growth thickness of the metal. Therefore, the present disclosure may use the same material system to obtain an adjustable threshold voltage corresponding to the effective work function metal within an adjustable range, which plays an important role for modulating the gate in integrated circuit.

DETAILED DESCRIPTION OF EMBODIMENTS

In order to make the objectives, technical solutions, and advantages of the embodiments of the present invention more comprehensible, the technical solutions in the embodiments of the present invention will be clearly and completely described in the following with reference to the accompanying drawings. Apparently, the described embodiments Is only a part but not all of the embodiments of the present invention. All other embodiments obtained by those skilled in the art based on the embodiments of the present invention without inventive labors will fall within the scope of the present invention.

In the prior art, it is a key factor for reducing the size of the semiconductor device by reducing the thickness of the gate dielectric layer. As a conventional gate dielectric layer of $SiO_2$, when the gate oxide thickness is reduced, the gate leakage current caused by direct tunneling will dramatically increase. From 90 nm technology nodes, new gate material should be introduced to increase the performance of semiconductor devices, and from the 45 nm technology node, the semiconductor process begins to use high-K materials with a higher dielectric constant to obtain the same gate capacitance as that of a ultrathin $SiO_2$ as the gate oxide when a physical thicknesses of the gate dielectric is relatively thicker. In addition, the metal gate replaces the polysilicon gate, which may eliminate the remote coulomb scattering effect and suppress the decrease of carrier mobility due to surface soft phonon scattering in high-K gate dielectric. At the same time, a phenomenon of non-tunable threshold voltage caused by the Fermi level pinning effect may be solved.

Figure 1:
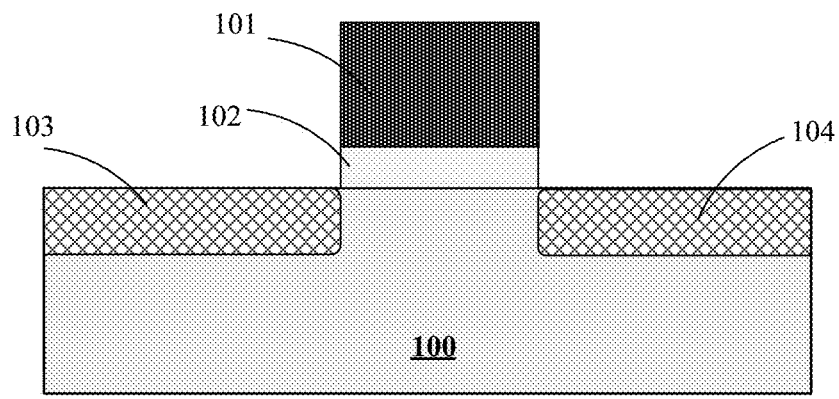
FIG. 1 is a schematic structural view of a high-K gate dielectric and a metal gate in the present disclosure.

FIG. 1 shows a schematic structural view of a high-K gate dielectric and a metal gate in the present disclosure. As shown in the figure, a reference sign 100 represents a semiconductor substrate, which may be a basic semiconductor substrate such as silicon, germanium or a compound semiconductor substrate such as silicon carbide, gallium arsenide, indium arsenide, indium phosphide and the like, the thickness of which may be, but is not limited to, 400 μm-800 μm. A reference sign 101 represents a gate of a work function metal material, wherein the work function metal material may be TiN, TiAlN, TiC, TaN, TaAlN, TaC and the like. A reference sign 102 represents a dielectric layer of a high-K material, wherein the high-K material may be $HfO_2$, HfSiO, HfSiON, HfTaO, HfTiO, HfZrO, $Al_2O_3$, $La_2O_3$, $ZrO_2$, LaAlO and the like. A reference sign 103 represents the source/drain, and reference sign 104 represents the drain/source.

Figure 2:
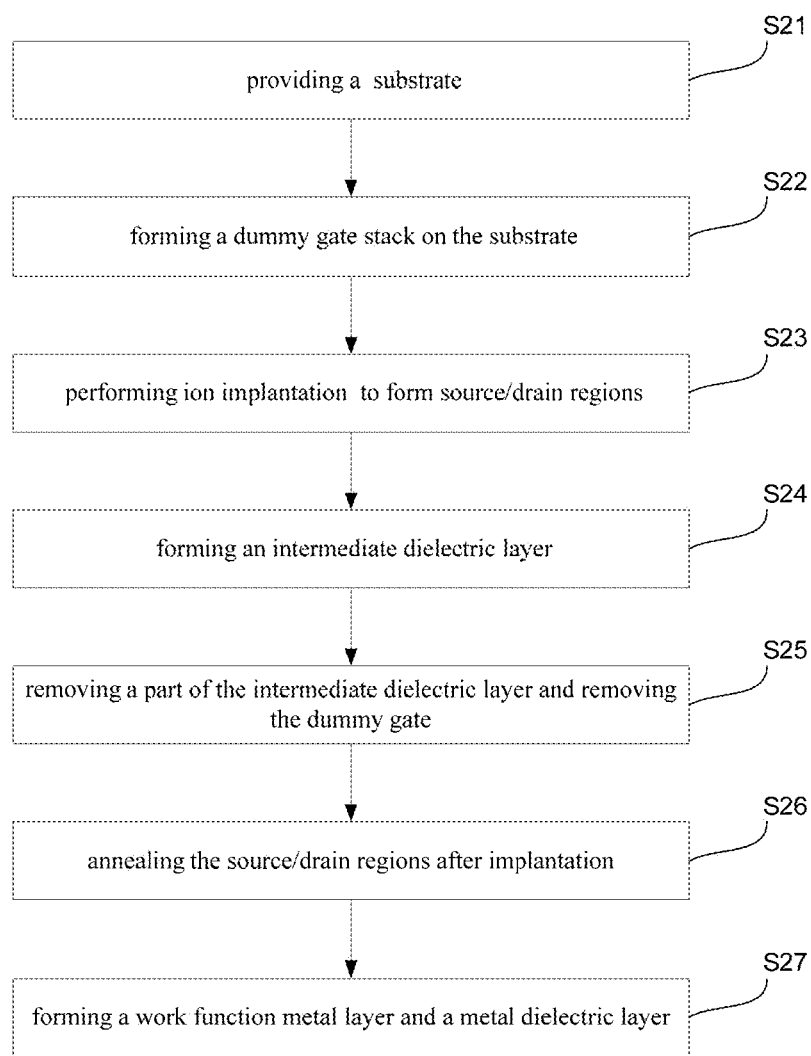
FIG. 2 is a flowchart of the gate-last process of the present disclosure.

FIG. 2 shows a flowchart of the gate-last process of the present disclosure. A step of S21 is to provide a semiconductor substrate such as a silicon substrate. A step of S22 is to form a dummy gate stack on the silicon substrate, and the dummy gate stack comprises a gate dielectric layer and a dummy gate on the gate dielectric layer. A step of S23 is to perform ion implantation on an exposed area of the semiconductor substrate at both sides of the dummy gate stack to form source/drain regions. A step of S24 is to form an intermediate dielectric layer for covering the source/drain regions and the dummy gate stack. A step of S25 is to remove a part of the intermediate dielectric layer to expose the dummy gate, and to remove the dummy gate. A step of S26 is to anneal the source/drain regions after implantation. A step of S27 is to form a work function metal layer and a metal dielectric layer.

FIG. 3A to 3H show schematic structural views of a semiconductor device in the gate-last process according to the present disclosure.

Figure 3A:
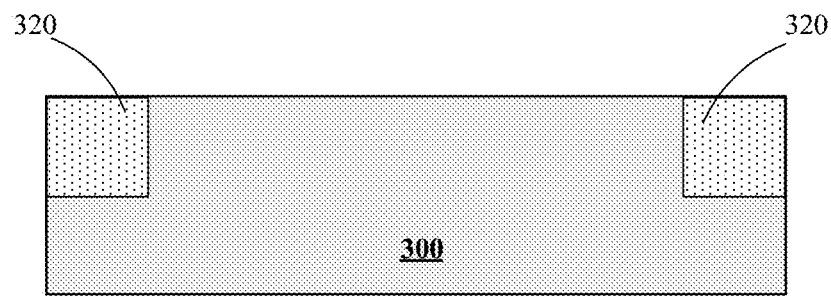
FIG. 3A to 3H are schematic structural view of a semiconductor device in the gate-last process according to the present disclosure.

As shown in FIG. 3A, a substrate 300 is provided. The substrate 300 may be a basic semiconductor substrate such as silicon, germanium or a compound semiconductor substrate such as silicon carbide, gallium arsenide, indium arsenide, indium phosphide and the like. Typically, the thickness of the substrate 300 may be, but is not limited to, a range of 400 μm-800 μm. An isolation region 320, such as shallow trench isolation (STI) region, has been formed in the substrate 300 to a depth in the range of 100-300 nm. The isolation region 320 is made of an insulating material, such as $SiO_2$, $Si_3N_4$, or the like.

Figure 3B:
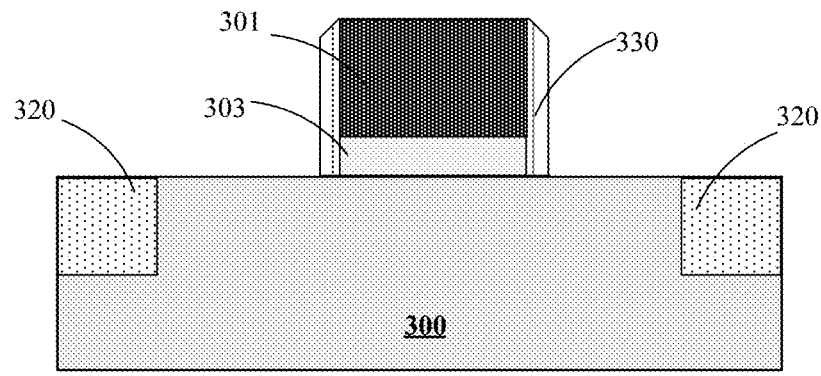

As shown in FIG. 3B, a gate dielectric layer 303 is deposited on the substrate 300 and then an amorphous silicon layer covering the gate dielectric layer 303 is deposited. In particular, the gate dielectric layer 303 and the amorphous silicon layer may be formed by PVD, CVD, ALD, PLD, MOCVD, PEALD, sputtering, molecular beam epitaxy (MBE) or other suitable deposition methods. The gate dielectric layer 303 may be, but not limited to, a high-K dielectric such as one of $HfO_2$, HfSiO, HfSiON, HfTaO, HfTiO, HfZrO, $Al_2O_3$, $La_2O_3$, $ZrO_2$, LaAlO or a combination thereof, the thickness which may be, but is not limited to, 1 nm-3 nm.

Subsequently, a photoresist layer is formed on the amorphous silicon layer. The material of the photoresist layer may be an ethylenic monomer material, a material containing an azidoquinone compound or a polyethylene laurate material or the like. The photoresist layer is patterned by photolithography to form a gate line pattern and then the amorphous silicon layer not covered by the photoresist layer and the gate dielectric layer 303 thereunder are etched to form the dummy gate stack including the dummy gate 301 and gate dielectric layer 303.

Alternatively, a spacer 330 is formed at sidewalls of the dummy gate stack to isolate the dummy gate stack. The sidewall 330 may be formed of $SiO_2$, $Si_3N_4$, SiON, silicon carbide, and/or other suitable materials. The sidewall 330 may have a multi-layers structure. The spacer 330 may be formed by a deposition and etching process, the thickness of which may be 10 nm-100 nm. The sidewalls 330 surround the dummy gate stack.

Figure 3C:
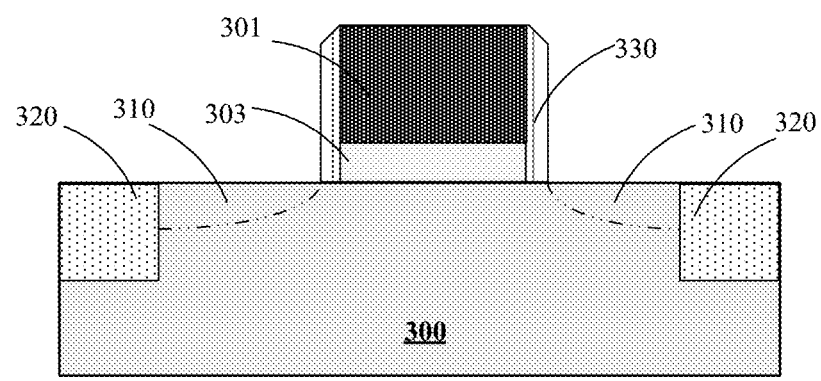

As shown in FIG. 3C, an ion implantation is implemented on an exposed area of the substrate 300 at both sides of the dummy gate 301 to form source/drain regions 310 which may be formed by a method including photolithography, ions implantation, diffusion, and/or other suitable processes. The ion implantation may create lattice defects in the substrate 300, so these defects should be eliminated by annealing at a low temperature or laser annealing after the ion implantation.

Alternatively, the ion implantation operation may be implemented firstly to form the source/drain regions 310 in the substrate 300, and then the spacer 330 may be formed. That is to say, the spacer 330 may be formed before or after the source/drain regions 310 are formed.

Figure 3D:
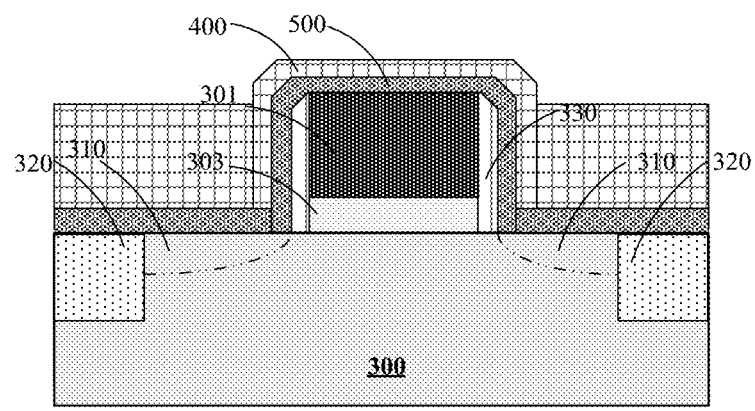

As shown in FIG. 3D, an etch stop layer 500 is formed. The etch stop layer 500 may include $Si_3N_4$, silicon oxynitride, silicon carbide, and/or other suitable materials. The etch stop layer 500 may be formed by using PVD, CVD, ALD, PLD, MOCVD, PEALD, sputtering, molecular beam epitaxy (MBE), or other suitable methods. The thickness of the etch stop layer 500 ranges from 5 nm to 20 nm. An interlayer dielectric layer 400 is further formed on the etch stop layer 500. The interlayer dielectric layer 400 may be formed on the etch stop layer 500 by PVD, CVD, ALD, PLD, MOCVD, PEALD, sputtering, molecular beam epitaxy (MBE) or other suitable method. The material of the interlayer dielectric layer 400 includes $SiO_2$, carbon-doped $SiO_2$, BPSG (Boron phosphorous doped silicate glass), PSG (phosphorous silicate glass), UGS (undoped silicate glass), silicon oxynitride, low-K material, or a combination thereof. The thickness of the interlayer dielectric layer 400 may range from 40 nm to 150 nm. Alternatively, the interlayer dielectric layer 400 covering the source/drain regions 310 and the dummy gate stack may be directly formed without forming the etch stop layer 500.

Figure 3E:
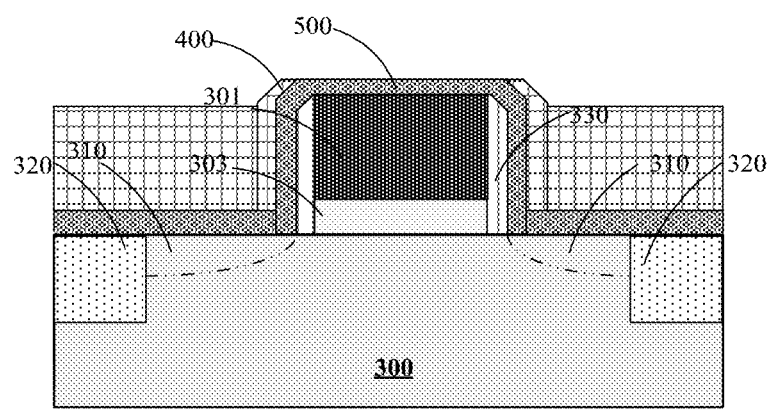

As shown in FIG. 3E, a planarization process is implemented to expose the etch stop layer 500 on the gate stack and to be substantially flush with a height of the interlayer dielectric layer 400. Since the material of the etch stop layer 500 is harder than the material forming the interlayer dielectric layer 400, the chemical mechanical polishing (CMP) is stopped at the etch stop layer 500.

Figure 3F:
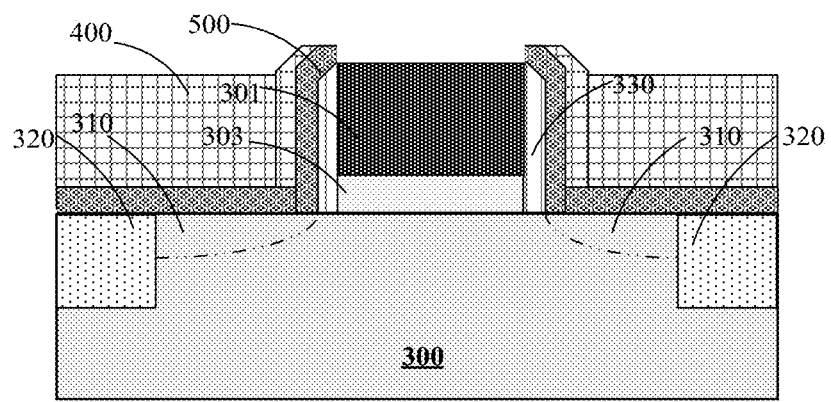

As shown in FIG. 3F, the exposed etch stop layer 500 is etched to expose the dummy gate 301. The etch stop layer 500 may be removed by wet etching and/or dry etching. The wet etching process includes an etching solution such as a solution containing hydrogen and oxygen and deionized water, and the dry etching process includes plasma etching and the like. In other embodiments of the present invention, the etch stop layer 500 may also be planarized by CMP until the dummy gate 301 is exposed. Alternatively, in an embodiment in which the etch stop layer 500 is not formed, and a part of the interlayer dielectric layer 400 may be removed by CMP until the dummy gate 301 is exposed.

Figure 3G:
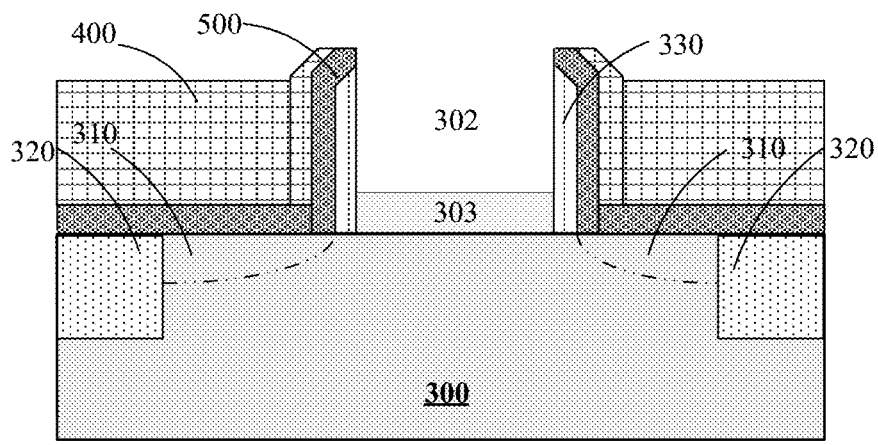

As shown in FIG. 3G, the dummy gate 301 is removed and the process is stopped at the gate dielectric layer 303. The dummy gate 301 may be removed by wet etching, dry etching, plasma etching or the like. After the dummy gate 301 is completely removed, a groove 302 surrounded by the spacers 330 is formed. At this time, a source-drain implantation annealing process is implemented. The annealing temperature for the annealing process ranges from 900° C. to 1200° C. The semiconductor structure may also be annealed by using an instant anneal process, such as laser anneal at a high temperatures of about 800° C.-1100° C.

Alternatively, an annealing may be further implemented to repair the gate dielectric layer 303. Alternatively, the previously deposited gate dielectric layer 303 may be removed and then a gate dielectric layer may be deposited again. Accordingly, the newly formed gate dielectric layer is formed at bottom of the groove 302 and covers an upper surface of the substrate 300 exposed by the groove 302. The material for the newly formed gate dielectric layer may be a thermal oxide layer including silicon oxide or silicon oxynitride and may be a high-K dielectric such as $HfO_2$, HfSiO, HfSiON, HfTaO, HfTiO, HfZrO, $Al_2O_3$, $La_2O_3$, $ZrO_2$, LaAlO, or a combination thereof, the thickness of which may be, but is not limited to, 1 nm-4 nm.

Figure 3H:
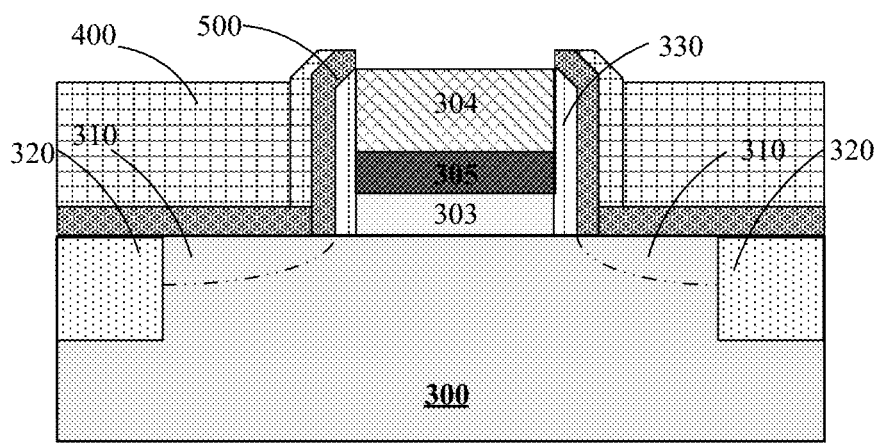

As shown in FIG. 3H, a replacement gate is formed in the groove 302. In one embodiment, the replacement gate is a metal gate. The metal gate may only include a metal conductor layer 304, and the metal conductor layer 304 may be directly formed on the gate dielectric layer 303. In other embodiments, the metal gate may further include a work function metal layer 305 and a metal conductor layer 304.

Preferably, the work function metal layer 305 is deposited on the gate dielectric layer 303, and then the metal conductor layer 304 is formed on the work function metal layer 305. The work function metal layer 305 may be made of materials such as TiN, TiAlN, TiC, TaN, TaAlN, TaC and the like, and has a thickness in the range of 3 nm-15 nm. The metal conductor layer 304 may be a single-layer or multi-layer structure, the material of which may be one or a combination of TaN, TaC, TiN, TaAlN, TiAlN, MoAlN, TaTbN, TaErN, TaYbN, TaSiN, HfSiN, MoSiN, $RuTa_x$, $NiTa_x$, W, Al, and the thickness of which may be, but not limited to, 10 nm-80 nm.

Alternatively, the work function metal layer 305 may be formed on the gate dielectric layer 303. After the dummy gate 301 is removed, the work function metal layer 305 may be exposed and a metal conductor layer 304 may be formed on the work function metal layer 305 in the formed opening. Since the work function metal layer 305 is formed on the gate dielectric layer 303, the metal conductor layer 304 is formed on the work function metal layer 305.

On the basis of a replacement of $SiO_2$ gate oxide/poly-silicon gate with the high-K gate dielectric/metal gate and the gate-last process, the present disclosure provides a transistor based on a gate with a variable work function and a method for fabricating the same.

In a semiconductor device process in the prior art, it is usually to utilize a physical-chemical reaction that occurs in the gas phase to form a solid deposition layer of metal, non-metal or compound on a surface of the wafer. The traditional PVD technology and chemical vapor deposition CVD may not get uniform and effective filling and covering of the entire pattern due to its structure with a large aspect ratio, which may easily cause the inhomogeneity of the threshold voltage of the FinFET device and cannot meet the requirements of nanotechnology and semiconductors IC's for the film performance. Atomic Layer Deposition (ALD) may deposit the material on the surface of the substrate in a form of a monatomic film with smooth, uniform and highly reproducible properties. Due to its self-limited growth characteristics, it has properties of ultra-thin film control, excellent film uniformity and step coverage, and it becomes the most suitable method for growing metal gate materials in the gate-last process.

The ALD process firstly introduces a first reactant into the reaction chamber for chemisorption on an active surface of the substrate until the surface of the substrate is saturated. The excess reactant is drawn out from the system to be removed and the second reactant is placed in the reaction chamber to react with the adsorbed substance on the substrate. The remaining reactants and the reaction by-products will be removed again by pumping or inert gas removal. As such, a monolayer saturated surface of the target compound is obtained. Such an ALD cycle enables layer-by-layer growth to allow precise control of the deposition thickness.

Since ALD is based on self-limited growth during an interaction, parameters for ALD need to be optimized for accurate thickness control and super conformality. In order to achieve complete monolayer coverage, sufficient quantities of thermally stable reactants, i.e. reactants that will not be decomposed at the reaction temperature, are introduced onto the substrate to ensure complete coverage. The following parameters are commonly used to control a dose of the reactant: the temperature of the reactant source, the flow rate, the partial pressure, and the pressure in the reaction chamber. The temperature of the chamber plays two major roles: to provide the activation energy required for the atomic layer deposition reaction and to help removing excess reactants and by-products during the process of forming the mono atom layer. The ALD reaction chamber may be a single wafer device, a small batches of wafer (<25 wafers) device, or a large batches of wafers (50-100 wafers) system. The single wafer device enables excellent process control of the multi-wafer systems and may dramatically increase throughput.

An ALD original reactant, i.e. a precursor source reactant, has a certain volatility and reproducible vaporization rate. Ideally, it does not react or decompose itself at the reaction temperature and it reacts easily with supplementary reactant and produces volatile by-products, and has a best size of a ligand. Alternatively, the original reactant may be liquid organometallics, or other original reactants suitable for film properties, impurity content, electrical properties and the like.

Figure 4:
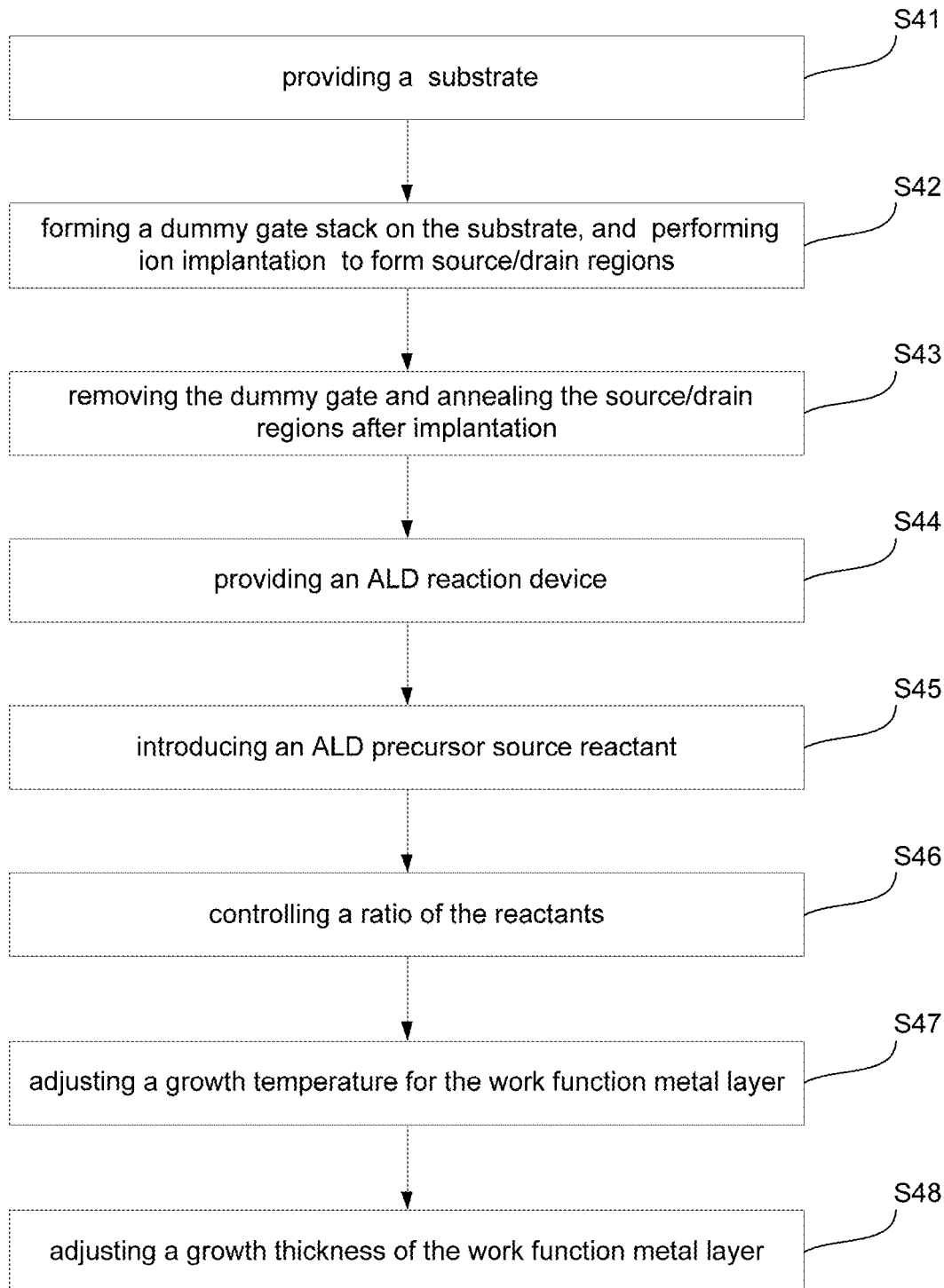
FIG. 4 is a flowchart of a method for manufacturing a transistor having a gate with a variable work function by using ALD according to an embodiment of the present disclosure.

In one aspect, FIG. 4 shows a flowchart of a method for manufacturing a transistor having a gate with a variable work function by using ALD according to an embodiment of the present disclosure. A step of S41 is to provide a semiconductor substrate for manufacturing the transistor, such as a substrate of silicon, germanium, or silicon carbide, gallium arsenide, indium arsenide, indium phosphide and the like. Typically, a thickness of the substrate may be, but is not limited to, a thickness range of 400 μm-800 μm. A step of S42 is to form a dummy gate stack on the substrate, and the dummy gate stack comprises a gate dielectric layer and a dummy gate on the gate dielectric layer, to perform ion implantation on an exposed area of the substrate at both sides of the dummy gate stack to form source/drain regions. A step of S43 is to form an etching stop layer and an intermediate dielectric layer for removing the dummy gate and to anneal the source/drain regions after implantation. A step of S44 is to provide an ALD reaction device and a reaction chamber. The ALD reaction chamber may be a hot wall reaction chamber or a cold wall reaction chamber. A step of S45 is to introduce an ALD precursor source reactant. A step of S46 is to control a ratio of the reactants. A step of S47 is to adjust a growth temperature for the work function metal layer. A step of S48 is to adjust a growth thickness of the work function metal layer.

In one embodiment of the present disclosure, a Ti-alloy or Ta-alloy metal may be used as the work function metal layer. In particular, the Ti alloy or the Ta alloy may be TiAlC (N) or TaAlC (N). The work function metal layer of TiAlC (N) is manufactured by the ALD method, in which the precursor source for Ti may be, but not limited to, titanium halide, TDMAT and the like; the precursor source for Aluminum may be, but not limited to, trialkylaluminum, alkylaluminum, Alanine and the like; and the nitrogen source may be, but not limited to, $NH_3$, $N_2$ or the like. The work function metal layer of TaAlC (N) is manufactured by the ALD method, in which the precursor source for tantalum may be, but not limited to, tantalum halide and PDMAT; the precursor source for aluminum may be, but not limited to, trialkylaluminum, alkylaluminum, ammonia coordinated alumoxane; and the nitrogen source may be, but not limited to, $NH_3$ or $N_2$ and the like.

Alternatively, the ALD of the invention may be a heating type of atomic layer deposition (T-ALD) or plasma enhanced ALD (PEALD).

Furthermore, an embodiment of the present invention may increase the effective work function of a metal by doping metal carbide, such as TiAlC/TaAlC, with nitrogen, to obtain TiAlC (N) or TaAlC (N). The value for the effective work function may be adjusted by adjusting the participating ratio of $N_2$ and $NH_3$ to regulate a content of nitrogen in the work function metal layer. In addition, The value for the tunable work function may be implemented by adjusting the pulse sequence of $N_2$ and $NH_3$.

Furthermore, the present invention may also implement a tunable work function value by adjusting the growth temperature for the metal and/or the growth thickness of the metal. In one embodiment of the present invention, the content of aluminum in the film may be changed by adjusting the growth temperature so as to obtain a tunable effective work function value.

Alternatively, a tunable work function value may be obtained by adjusting any one of four terms of the reactant ratio, the pulse sequence, the growth temperature of the metal, and the growth thickness of the metal, or a combination thereof.

In another aspect, the present invention also provides a transistor device having a gate with variable work function. The material of the gate with a variable work function may be, but not limited to, TiN, TiAlN, TiC, TaN, TaAlN, TaC, TiAlC, TaAlC, TiAlCN or TaAlCN. A tunable work function value may be obtained by adjusting any one of the reactant ratio, the pulse sequence, the growth temperature of the metal, and the growth thickness of the metal, or a combination thereof during the ALD process. In particular, in one embodiment of the present invention, a tunable work function value may be implemented by adjusting the participation ratio of $N_2$ and $NH_3$ and/or adjusting the pulse sequence of $N_2$ and $NH_3$. The tunable work function value may also be implemented by adjusting the growth temperature of the metal and the growth thickness of the metal so as to get a tunable threshold voltage.

The transistor having a gate with a variable work function and the method for manufacturing the same according to embodiments of the present disclosure may implement a tunable work function by adjusting a participating ratio and a pulse sequence of $N_2$ and $NH_3$, the growth temperature and growth thickness of the metal, so as to obtain an adjustable threshold voltage corresponding to the effective work function metal within an adjustable range, which plays an important role for modulating the gate in integrated circuit.

The foregoing descriptions are only specific embodiments of the present invention, but the scope of the present invention is not limited thereto. Anyone skilled in the art may easily conceive changes or substitutions within the technical scope disclosed in the present invention. Therefore, the scope of the present invention should be defined by the claims.

What is claimed is:

1. A method for manufacturing a transistor having a gate with a variable work function, comprising:
   providing a semiconductor substrate;
   forming a dummy gate stack on the semiconductor substrate and performing ion implantation on an exposed area of the semiconductor substrate at both sides of the dummy gate stack to form source/drain regions;
   removing the dummy gate and annealing the source/drain regions;
   providing an atomic layer deposition reaction device;
   introducing a precursor source reactant into the atomic layer deposition reaction device; and
   controlling an environmental factor for the atomic layer deposition reaction device to grow a work function metal layer with a tunable work function.

2. The method according to claim 1, wherein the environmental factor for the atomic layer deposition reaction device comprises any one of a ratio of the precursor source reactant, a pulse sequence, a growth temperature and a growth thickness or a combination thereof.

3. The method according to claim 2, wherein a material for the work function metal layer is titanium alloy or tantalum alloy.

4. The method according to claim 3, wherein a material for the work function metal layer is TiAlC(N) or TaAlC(N).

5. The method according to claim 4, wherein the precursor source reactant for tantalum in TaAlC(N) is tantalum halide and/or PDMAT, the precursor source reactant for Al is trialkylaluminum, alkylaluminoxane and/or ammonia coordinated alumoxane, and the precursor source reactant for nitrogen is $NH_3$ and/or $N_2$.

6. The method according to claim 2, wherein the ratio of the precursor source reactant comprises a ratio of the amounts of $NH_3$ and/or $N_2$.

7. The method according to claim 2, wherein the pulse sequence comprises a participating pulse sequence of $NH_3$ and $N_2$.

8. The method according to claim 2, wherein the growth temperature is adjusted which may change an aluminum content ratio of the work function metal layer.

9. The method according to claim 2, wherein the atomic layer deposition may be a heating type of atomic layer deposition or a plasma enhanced atomic deposition.

10. The method according to claim 1, wherein the precursor source reactant for titanium in TiAlC(N) is titanium halide and/or TDMAT, the precursor source reactant for aluminum is trialkylaluminum, alkylaluminoxane and/or ammonia coordinated alumoxane, and the precursor source reactant for nitrogen is NH3 and/or N2.

* * * * *